United States Patent
Welty

[19]

[11] Patent Number: 5,840,163
[45] Date of Patent: Nov. 24, 1998

[54] RECTANGULAR VACUUM-ARC PLASMA SOURCE

[75] Inventor: Richard P. Welty, Boulder, Colo.

[73] Assignee: Vapor Technologies, Inc., Boulder, Colo.

[21] Appl. No.: 577,810

[22] Filed: Dec. 22, 1995

Related U.S. Application Data

[63] Continuation of Ser. No. 233,006, Apr. 25, 1994, Pat. No. 5,480,527.

[51] Int. Cl.$^6$ .................................................. C23C 14/32
[52] U.S. Cl. ................................ 204/192.38; 204/192.13; 204/298.03; 204/298.41; 118/723 VE; 427/580; 250/426; 315/111.81
[58] Field of Search ...................... 204/192.13, 192.38, 204/298.03, 298.05, 298.41; 118/723 R, 723 HC, 723 VE; 427/580; 250/426; 315/111.81

[56] References Cited

U.S. PATENT DOCUMENTS

| | | | |
|---|---|---|---|
| 484,582 | 10/1892 | Edison . | |
| 2,972,695 | 2/1961 | Wroe | 313/157 |
| 3,612,937 | 10/1971 | Smirnov et al. | 313/197 |
| 3,625,848 | 12/1971 | Snaper | 204/192 |
| 3,783,231 | 1/1974 | Sablev et al. | 219/123 |
| 3,793,179 | 2/1974 | Sablev et al. | 204/298 |
| 3,836,451 | 9/1974 | Snaper | 204/298 |
| 4,092,516 | 5/1978 | Martin | 219/121 |
| 4,109,922 | 8/1978 | Martin | 277/34.3 |
| 4,220,889 | 9/1980 | Marhic et al. | 313/38 |
| 4,452,686 | 6/1984 | Axenov et al. | 204/298 |
| 4,492,845 | 1/1985 | Kljuchko et al. | 219/121 |
| 4,551,221 | 11/1985 | Axenov et al. | 204/298 |
| 4,587,432 | 5/1986 | Aitken | 250/492.2 |
| 4,609,564 | 9/1986 | Pinkhasov | 427/37 |
| 4,645,895 | 2/1987 | Boxman et al. | 219/76.13 |
| 4,673,477 | 6/1987 | Ramalingam et al. | 204/192.38 |
| 4,724,058 | 2/1988 | Morrison, Jr. | 204/192.38 |
| 4,849,088 | 7/1989 | Veltrop et al. | 204/298 |
| 4,859,489 | 8/1989 | Pinkhasov | 427/37 |
| 5,037,522 | 8/1991 | Vergason | 204/298.41 |
| 5,269,898 | 12/1993 | Welty | 204/298.41 |
| 5,279,723 | 1/1994 | Falabella et al. | 204/192.38 |
| 5,282,944 | 2/1994 | Sanders et al. | 204/192.38 |
| 5,298,136 | 3/1994 | Ramalingam | 204/192.38 |
| 5,433,836 | 7/1995 | Martin et al. | 204/298.41 |
| 5,435,900 | 7/1995 | Gorakhovsky | 204/298.41 |
| 5,468,363 | 11/1995 | Falabella | 204/298.41 |

OTHER PUBLICATIONS

Aksenov et al., "Transport of Plasma Streams in a Curvilinear Plasma–Optics System," Soviet Journal of Plasma Physics, 4(4), Jul.–Aug. 1978.

*Primary Examiner*—R. Bruce Breneman
*Assistant Examiner*—Rodney G. McDonald
*Attorney, Agent, or Firm*—Davis, Graham & Stubbs LLP

[57] ABSTRACT

A rectangular vacuum-arc plasma source and associated apparatus for generating and directing a stream of plasma containing an ionized vapor of a cathode material toward a substrate by vacuum arc evaporation of a rectangular planar cathode mounted in a rectangular plasma duct. The rectangular duct conducts the plasma from the cathode to the substrate region, while intercepting the molten droplets of cathode material also generated by the arc. Magnets control the arc motion on the cathode surface while simultaneously generating the magnetic field which guides the plasma through the duct. Benefits of a filtered cathodic arc (fully ionized vapor stream, elimination of splattered droplets) are combined with the benefits of a rectangular source (uniform evaporation from the source and uniform deposition on the substrate using linear motion). The rectangular source may be extended indefinitely in length, thus allowing coating or ion implantation on large or long substrates.

30 Claims, 5 Drawing Sheets

RECTANGULAR VACUUM-ARC PLASMA SOURCE

This is a continuation of application Ser. No. 08/233,006 filed on Apr. 25, 1994 U.S. Pat. No. 5,480,527.

FIELD OF THE INVENTION

This invention relates to vacuum arc evaporation, and more particularly to filtered cathodic arc evaporation of a rectangular planar cathode mounted in a rectangular plasma duct. The rectangular source may be extended indefinitely in length, thus the invention has particular utility for coating or ion implantation on a long or large substrate.

This invention realizes the benefits of a filtered cathodic arc (fully ionized vapor stream, elimination of splattered droplets) in combination with the benefits of a rectangular source (uniform evaporation from the source and uniform deposition on the substrate using linear motion) in order to attain uniform coating or implantation on a large substrate with minimal contamination of the substrate by droplets of the molten source material.

BACKGROUND OF THE INVENTION

In the last decade or so, vacuum arc evaporation has come into wide commercial use for deposition of metal, alloy, and metal compound coatings on a substrate to be coated. Vacuum arc discharges have also been used as ion sources for such applications as ion implantation, beam accelerators, and rocket propulsion.

The process of vacuum arc evaporation for coating or implanting a substrate includes a cathode target composed of the material to be deposited, and a substrate which is to be coated. The target is vaporized by a high current, low voltage arc plasma discharge in a vacuum chamber which has been evacuated to a pressure of typically less than 0.001 mbar. The substrates to be coated or implanted are usually placed in the vacuum chamber facing the evaporable surface of the target, at a distance of typically 10–100 cm. Typical arc currents range between 25 and 1000 amperes, with voltages between 15 and 50 volts.

The arc plasma discharge conducts electric current between a cathode and an anode through the plasma created by vaporization and ionization of the target material by the arc. The cathode (negative electrode) is an electrically isolated source structure which is at least partially consumed during the process. The consumable portion of the cathode is called the "target" and is often fabricated as a replaceable element clamped to a cooled, non-consumable element called the cathode body. The anode (positive electrode) may be an electrically isolated structure within the vacuum chamber or may be the vacuum chamber itself, and is not consumed in the process.

An arc is ignited on the evaporable surface of the cathode target, commonly by means of mechanical contact, high voltage spark, or laser irradiation. The ensuing arc plasma discharge is highly localized in one or more mobile arc spots on the cathode target surface, but is distributed over a large area at the anode. The extremely high current density in the arc spot at the cathode, estimated to be $10^6$–$10^8$ amperes/$cm^2$, results in local heating, evaporation, and ionization of the cathode source material.

Each arc spot emits a jet of plasma in a direction approximately perpendicular to the cathode target surface, forming a luminous plume extending into the region between the cathode and anode. The substrate to be coated or implanted is placed between or adjacent to the cathode and anode. The vapor of cathode material is typically further accelerated toward the substrate surface by an applied voltage, and condenses onto or becomes imbedded into the surface of the substrate. Reactive gasses may be introduced into the vacuum chamber during the evaporation process, resulting in the formation of material compounds involving the target material, reactive gas, and/or the substrate material.

Below about 70–100 amperes of arc current, depending on the target material, only a single arc spot exists on the surface of the cathode source material. At higher arc currents, multiple arc spots car exist simultaneously on the target surface, each carrying an equal fraction of the total arc current. An arc spot, in the absence of applied magnetic fields, tends to move randomly around the target surface, leaving a trail of microscopic crater-like features on the target surface.

An externally applied magnetic field exerts a force on the arc jet in a direction perpendicular to both the field lines and the jet, and can have a dominant influence on the large-scale average movement of the arc spot although the small-scale motion of the arc remains semi-random. The direction of the motion of the arc spot in a magnetic field is opposite or "retrograde" to the vector J×B direction expected based on Ampere's law, considering the electron current emitted from the cathode. This phenomenon is due to complex dynamic effects within the arc jet, and has been widely reported and discussed.

An undesirable side effect of the vaporization of the target material at the arc spot is the generation of droplets of molten target material, which are ejected from the target by reaction forces due to expansion of the vapor jet. These droplets are commonly called macroparticles, and range in diameter from sub-micron to tens of microns. The macroparticles can become imbedded in the coating when they land on the substrate to be coated, forming objectionable irregularities, or the macroparticles can stick to the substrate and later fall off, causing pits in the coating.

Various strategies have been devised to reduce the number of macroparticles incorporated into the coating on the substrate. These strategies fall generally into two categories: (1) a first category using some form of magnetic field to control and accelerate the arc, thus reducing macroparticle generation, and (2) a second category using a filtering apparatus between the cathode source and the substrate so as to transmit the ionized fraction of the cathode output to the substrate, but to block the molten droplets.

The magnetic methods of the first category are generally simpler than the filtering methods, but do not completely eliminate macroparticle generation. The filtering methods of the second category are generally more effective at removing macroparticles than the magnetic methods, but require complex apparatus and reduce the source output significantly.

Filtering methods work by placing the substrate out of the line of sight of the cathode target surface, so that macroparticles emitted from the cathode do not impinge directly on the substrate. An angled filtering duct is interposed between the cathode and the substrate to transport the plasma to the substrate.

In order to reach the substrate, the charged plasma emitted from the cathode source is deflected electromagnetically within the filtering duct through an angle of 45°–180° so as to pass through the bend in the filtering duct and to impinge on the substrate. The uncharged macroparticles are not deflected by the electromagnetic field and continue in a course which hits the walls of the filtering duct so that ideally the macroparticles do not reach the substrate. In practice, however, bouncing of macroparticles off the filter walls and/or entrainment of small particles in the plasma can result in transmission of some macroparticles through the filter to reach the substrate.

Prior filtered cathodic arcs have been based upon circular or cylindrical cathode and filter geometry, generally limiting potential applications to small substrates or special shapes.

Examples of the early work done in the field of arc evaporation are described in several United States patents, including U.S. Pat. No. 484,582 of Edison which describes the use of vacuum arc evaporation for depositing a coating onto a substrate; U.S. Pat. No. 2,972,695 of Wroe which describes a magnetically stabilized vacuum arc evaporation apparatus; U.S. Pat. Nos. 3,625,848 and 3,836,451 of Snaper which describe arc evaporation apparatus with particular electrode configurations, and the use of a magnetic field to increase the evaporation rate and to direct ions to the substrate; and U.S. Pat. Nos. 3,783,231 and 3,793,179 of Sablev, et al. which describe particular configurations of electrodes and shields, and describe use of a magnetic field activated whenever the arc spot moves off the desired evaporation surface of the cathode source material.

Examples of cathodic arcs confined within a circular or racetrack path upon the cathode are illustrated by U.S. Pat. No. 4,724,058 of Morrison; U.S. Pat. No. 4,673,477 of Ramalingam, et al.; and U.S. Pat. No. 4,849,088 of Veltrop, et al. Each of the foregoing references describe an arc evaporation apparatus using an arched magnetic field in the shape of a closed loop tunnel, which confines the arc spot to a closed loop racetrack trajectory at a fixed or movable location on the cathode surface. Confinement and acceleration of the arc by the magnetic field is said to reduce generation of macroparticles by the arc discharge. The means required to generate such a magnetic field are widely known in the art of planar magnetron sputtering. It is also known, for example, to move the electromagnetic field generating means of the arc, either mechanically as taught by Ramalingam, et al. and by Veltrop, et al., or by use of multiple electromagnets as taught by Morrison.

Examples of elongated, cylindrical cathodes are included in U.S. Pat. Nos. 4,609,564 and 4,859,489 of Pinkhasov; U.S. Pat. No. 5,037,522 of Vergason; and U.S. Pat. No. 5,269,898 of Welty, all of which describe the use of an elongated cathode in the form of a cylinder or rod, and make use of the self-magnetic field of the arc current to force its motion along the length of the cathode. Welty teaches that macroparticle generation can be reduced by application of an additional axial magnetic field component to accelerate and control the arc motion.

U.S. Pat. No. 4,492,845 of Kljuchko, al. describes an arc evaporation apparatus using an annular cathode, and in which the evaporable cathode surface is its outer wall, facing a cylindrical anode of larger diameter and greater length than the cathode. The substrates to be coated are disposed inside the annular cathode, not facing the evaporable surface, and are coated by ionized material reflected back by the electromagnetic field at the anode. A coaxial magnetic field is described for enhancing the reflection from the anode. Macroparticles ejected from the cathode surface are not reflected electrically by the anode (although they may bounce off it mechanically). As a result, macroparticle incorporation in the coating is reduced.

Examples of efforts to reduce the number of macroparticles incorporated into the coating on the substrate by using some form of a filtering apparatus between the cathode source and the substrate to transmit the charged ionized fraction of the cathode output and to block the uncharged macroparticles are shown in work done by Aksenov/Axenov, Falabella and Sanders.

A publication by Aksenov, et al. ("Transport of plasma streams in a curvilinear plasma-optics system", Soviet Journal of Plasma Physics, 4(4), 1978) describes the use of a cylindrical plasma duct containing a 90 degree bend, with electromagnet coils to create a solenoidal magnetic field through the duct, and with a circular arc evaporation cathode at one end of the duct and a substrate at the other end. The plasma emitted by the cathode is reflected from the duct walls by the magnetic and electric fields present, and transported along the magnetic field through the duct to the substrate, while the uncharged macroparticles are not deflected by the magnetic or electrostatic fields and are intercepted by the duct walls.

U.S. Pat. No. 5,279,723 of Falabella et al. describes an apparatus essentially similar to the original Aksenov filter, using a cylindrical duct with a 45 degree bend, a circular or conical cathode and anode, and including improvements to various components including the shape of the cathode and the internal baffles which reduce macroparticle transmission.

U.S. Pat. No. 4,452,686 of Axenov et al. describes a straight cylindrical filtering duct with no bend, a circular cathode located at one end of the duct, electromagnet coils to generate a solenoidal magnetic field through the duct, and with an additional electrode located in the center of the duct which blocks direct line of sight deposition from the cathode to the substrate. Plasma emitted by the cathode is deflected by the magnetic and electric fields at the duct wall and central electrode, and transported along the magnetic field through the duct and around the central electrode. The uncharged macroparticles are not deflected by the magnetic or electric fields and are intercepted by the central electrode.

U.S. Pat. No. 5,282,944 of Sanders, et al. describes a device somewhat similar to that of U.S. Pat. No. 4,452,686 of Axenov, using a straight cyclindrical filtering duct and a central shield which prevents macroparticles emitted at low angles from the cathode from reaching the substrate directly. Electromagnet coils generate a magnetic field within the duct which is substantially solenoidal near the duct wall. The evaporable surface of the cathode in this case is the outer surface of a short cylinder oriented coaxially with the filter duct, such that the plasma emitted from the cathode is directed radially at the outer wall of the filter duct and is deflected through approximately 90 degrees by the magnetic field and the electric field at the duct walls, and transported along the magnetic field to the end of the duct at which the substrate is located. Internal electrodes are disclosed to enhance deflection of the plasma at the end of the circular filtering duct opposite to the end at which the substrate is located.

None of the references of the prior art disclose a cathode having an evaporable surface of rectangular shape and using magnetic field polarity reversal to control the movement of the arc on the cathode surface, nor is a filtering duct having rectangular cross section disclosed. Accordingly, despite the work illustrated above, there is still a need for an improved filtered cathodic arc. Preferably, the filtered cathodic arc would include a rectangular deposition source.

Rectangular deposition sources are desirable for the coating of large substrates, coating of sheet material in roll form, and for coating of continuous streams of smaller substrates on a linear conveyor or circular carousel. Development of rectangular planar magnetron sputtering cathodes in the 1970's has led to widespread commercialization of sputtering for the coating of substrates in such configurations (see, for example the magnetron sputtering cathode of Welty, U.S. Pat. Nos. 4,865,708 and 4,892,633).

Filtered cathodic arc sources have the advantage that the stream of vapor of cathode material emitted from the source is fully ionized, unlike non-arc-based deposition methods such as evaporation and sputtering. The fully ionized vapor stream from a rectangular source would allow greater control over the energy of the atoms arriving at she substrate for coating or implantation, and would increase the reactivity of the vapor in forming compounds with reactive gases in the system, or with the substrate directly.

The present invention realizes the benefits of a filtered cathodic arc (fully ionized vapor stream, elimination of splattered droplets) and the benefits of a rectangular source (uniform evaporation from the source and uniform deposition on the substrate using linear motion) in order to coat or implant a long or large substrate. It is a goal of the present invention, therefore, to provide a filtered cathodic arc on a rectangular vacuum-arc cathode to accomplish the tasks that cannot be accomplished by the prior art.

SUMMARY OF THE INVENTION

The present invention provides means to generate and direct a plasma beam over a rectangular area, for the purpose of forming a coating or performing ion implantation on a substrate. A rectangular cathode is mounted in an angled duct of rectangular cross section, which confines the plasma and deflects it toward the substrate region while intercepting the molten droplets of cathode material also generated by the arc. The region of the plasma duct in which the cathode is mounted is referred to herein as the entrance arm of the duct, while the substrate is mounted adjacent to the exit arm of the duct.

A magnetic field is created within the duct which directs the plasma through the duct while simultaneously causing the arc to move in one direction down the length of the rectangular cathode. When the arc reaches the end of the cathode, a sensor provides a signal upon which the polarity of at least a portion of the magnetic field is reversed, causing the arc to reverse direction and move toward the opposite end of the cathode. The polarity of the magnetic field is switched whenever the arc reaches either end of the cathode, thus scanning the arc back and forth along the length of the rectangular cathode.

Although the polarity (direction) of the magnetic field is reversed repetitively, the shape of the magnetic field and its orientation with respect to the duct preferentially remain substantially the same, and plasma is transmitted through the duct in either polarity. In a preferred embodiment of the invention, a region of converging magnetic field lines adjacent to the cathode forms a magnetic mirror which reflects plasma toward the exit of the duct.

The movement of the arc along the length of the cathode target is due to the component of the magnetic field adjacent to the target surface which is parallel to the plane of the target surface and perpendicular to the long axis of the rectangular target. For magnetic flux components in this orientation, two polarities (directions) are possible. When the field has one polarity the arc moves along the length of the cathode in the direction given by the retrograde J×B vector as described above. When the field has the opposite polarity, the arc moves along the length of the cathode in the opposite direction.

By reversing the polarity of the magnetic field based on signals from the sensors located at the ends of the cathode, while maintaining the orientation of the flux lines with respect to the target surface, the direction of the movement of the arc along the length of the cathode can be reversed periodically, causing the arc to scan back and forth along the length of the rectangular cathode along a relatively straight line.

The reversible magnetic field adjacent to the evaporable surface of the target, which causes the arc to move along the length of the target, may be generated using electromagnet coils located outside the duct or within the cathode body. It is known in the prior art to generate a reversible field using the self magnetic field of the arc current flowing through the rectangular cathode. For example, connecting the arc current simultaneously to both ends of the rectangular cathode and varying the fraction of the total current which flows to each end of the cathode, based on the signals from the sensors located at the ends of the cathodes, will generate a magnetic field component in the orientation required to cause the arc to move along the length of the cathode, as described in U.S. Pat. No. 5,269,898 of Welty.

As the direction in which the majority of the arc current flows within the rectangular cathode is reversed based on signals from the sensors, the polarity (direction) of the magnetic field component parallel to the target surface also reverses, thus reversing the direction of arc travel along the length of the target. Likewise, as also described in U.S. Pat. No. 5,269,898, the magnetic field component which causes the arc scanning may also be generated by passing a control current along the length of the cathode and reversing its direction based on the sensor signals, or by switching the arc current input from one end of the cathode to the other as described in U.S. Pat. No. 5,037,522 of Vergason. No suggestion has been made in the prior art to generate the reversible magnetic field using magnetic means independent of currents flowing through the cathode itself.

Transport of the plasma through the duct is due primarily to the component of the magnetic field adjacent to the duct walls which is parallel to the plane of the walls and parallel to the axis of the duct. Diffusion of the electrons of the plasma through the magnetic field toward the duct walls creates an electric field component perpendicular to the duct wall which reflects the positively charged ions, thus allowing them to continue travel along the duct and around the bend in the duct. The uncharged macroparticles are not reflected and are therefore intercepted by the duct walls, or by baffles which may be mounted perpendicular to the duct wall and extending a short distance into the duct to reduce bouncing of the macroparticles off the duct walls. The polarity of the magnetic field components within the duct and adjacent to the duct walls is preferentially switched simultaneously with the polarity of the field component adjacent to the target surface which causes the arc scanning, such that the shape of the magnetic field throughout the duct remains the same despite the reversals in polarity. It is also within the scope of the present invention, however, to reverse the polarity of the field only in the region of the target surface while maintaining a static (non-reversing) magnetic field in the rest of the duct using electromagnets or permanent magnets. Variations in the net shape of the magnetic field in this latter case may cause periodic variations in transmission of plasma through the duct as a function of the reversal of the field near the target surface.

Since the plasma jet is emitted from the cathode primarily in the direction perpendicular to the evaporable surface, it tends to impinge on the duct wall most strongly in the region of the outer radius of the bend in the duct. In order to increase the transmission of plasma through the duct it is desirable to intensify the strength of the magnetic field in this region. An additional factor is that cathode target materials of differing atomic weight and melting point are emitted from the target with different velocities and kinetic energies. It is therefore desirable to vary the strength of the magnetic field, particularly in the region of the bend in the duct, to optimize the transmission for various materials. Accordingly, in a preferred embodiment of the present invention a separate electromagnet coil is provided in the vicinity of the outer radius of the bend in the duct, opposite the evaporable surface of the target, in which the current may preferably be varied independent of the current in the other coils generating portions of the magnetic field in the duct.

It should be noted that in the prior art of cylindrical plasma ducts (or in the straightforward way that the prior art might have been extended to a rectangular duct), in which one or more electromagnet coils are disposed encircling the duct in order to create a solenoidal magnetic field through the duct, the wires comprising the coil(s) must necessarily be spaced more closely together at the inside radius of the bend in the duct than at the outside radius. This results in the magnetic field inside the duct having greater strength towards the inner radius of the duct where the wires are spaced more closely, and lower strength towards the outer radius of the duct where the arc plasma jet impinges. The prior art therefore teaches away from this aspect of the present invention, in which the magnetic field strength inside the duct at the outer radius of the bend can be strengthened to equal or exceed the field strength at the inner radius, in order to increase the transmission of plasma through the duct.

The electric field perpendicular to the duct wall, which reflects the positively charged ions from the duct wall in the prior art and in the aspects of the present invention described above, is created by diffusion of the plasma electrons transversely through a magnetic field substantially parallel to the filter duct walls. It is also possible to reflect ions away from duct wall by a second method, namely by creating near the wall a region in which the magnetic flux lines converge as they approach the wall in an approximately perpendicular direction, creating a region known as a magnetic mirror. Plasma electrons approaching the wall are reflected or retarded as they enter the region of converging flux lines, creating an electron density gradient resulting in an electric field which reflects the plasma ions as well. Magnetic mirrors are commonly used for plasma confinement in laboratory apparatus and other plasma devices.

The utility of a magnetic mirror field is disclosed in the present invention for the first time in the art of filtered vacuum-arc plasma sources. The need for the function provided by the mirror field is illustrated, for example, in the prior art illustrated by U.S. Pat. No. 5,282,944 of Sanders, et al. in which a number of insulating rings, labeled 21 in FIGS. 2 and 3 thereof, are pointed out as necessary to prevent plasma loss to the duct walls in the areas where the magnetic field passes through the duct wall. The inclusion of a magnetic mirror field region in the entrance arm of a preferred embodiment of the present invention creates a preferred direction for plasma flow toward the exit arm of the duct, while simultaneously providing the magnetic field component (parallel to the surface of the target and perpendicular to its long axis) which causes the arc to move down the length of the target. Reversal of the polarity of the magnetic mirror field, and thus the field component parallel to the target surface, causes the direction of travel of the arc on the target surface to reverse without changing the shape or function of the mirror field.

The combination and superposition of independently variable magnetic field sources providing a solenoidal magnetic field region in the exit arm of the plasma duct, a "bumper" field region near the outer radius of the bend in the duct, and a magnetic mirror field region in the entrance arm of the duct adjacent to the cathode provide sufficient adjustability to allow optimization of plasma transport through the duct for a wide variety of target materials. It is to be understood, however, that not all of these elements need be present in an embodiment of the present invention, and that the elements present need not be independently variable, particularly in the case of a source which is optimized for a single target material. For example, depending on the method used for reversing the polarity of the magnetic field region near the target surface, a single solenoidal electromagnet surrounding the entire duct may be sufficient.

The present invention differs from the prior art in the rectangular shape of the cathode and plasma duct, in the method of control of arc movement on the cathode, and in the shape and control of the magnetic field in the plasma duct.

In particular, the disclosed magnetic field shape and control methods make it possible to construct a compact, efficient plasma source with a rectangular output aperture which can be made as long as desired, thus providing the benefits of a filtered cathodic arc in combination with the benefits of a rectangular deposition source. The field reversal technique for arc control on the cathode surface allows the width of the cathode to be made much smaller than is possible using the racetrack-style magnetic field of the prior art.

The plasma duct can therefore be made much narrower and shorter, resulting in a compact design which is easier to integrate into a vacuum system than the bulky filters of the prior art, particularly in systems containing multiple plasma sources. The narrow cathode and scanned arc also permit more uniform erosion of the target along its length and higher target material utilization than is possible with planar racetrack-style cathodes.

The advantages of the present invention permit the source to be extended indefinitely in length, thus providing the benefits of filtered arc deposition or implantation to applications requiring rectangular or extended vapor sources.

DETAILED DESCRIPTION OF THE PREFERRED EMBODIMENTS

The present invention provides a way to generate and direct a plasma beam over a rectangular area for the purpose of forming a coating or performing ion implantation on a substrate.

Figure 1:
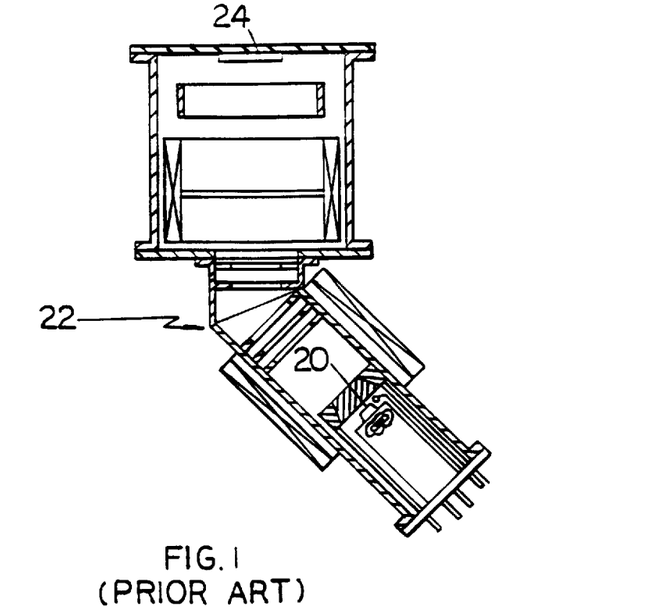
FIG. 1 is a schematic illustration of a prior art filtered vacuum arc using a circular cathode and a cylindrical plasma duct.

FIG. 1 shows a prior art cathode 20 coupled to a filter 22 capable of separation of macroparticles from an ion flux produced by cathodic arc discharge. The cathode 20 is frustrum-shaped, having a circular face and tapered sides. The filter 22 includes two solenoids, end to end, but placed at a 45° angle to one another for preventing line of sight from an arc spot on the cathode to a substrate 24 to be coated while providing a path for the ions and electrons to flow, and it includes a series of baffles for trapping the macroparticles.

Figure 2:
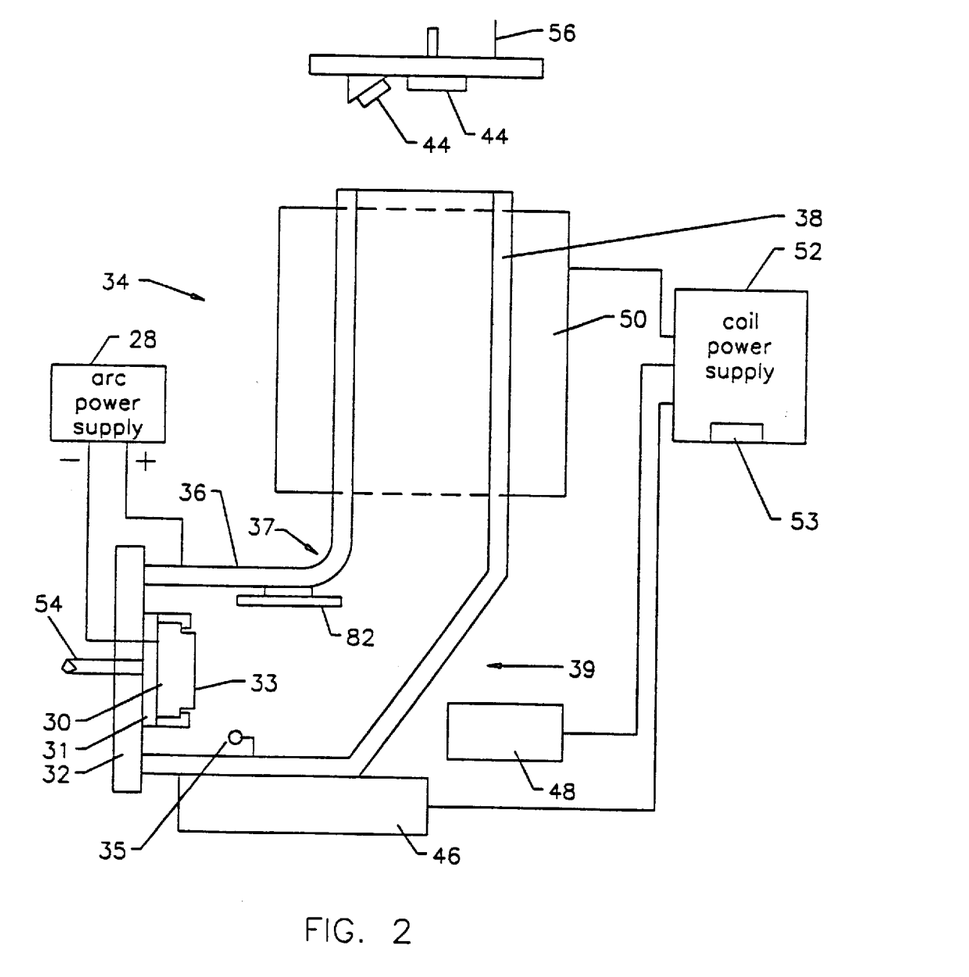
FIG. 2 is a schematic view of the filtered arc plasma source of the present invention.

With reference to the schematic view of FIG. 2, one preferred embodiment of this invention can be understood to include a cathode target 30 on cathode body 31. Target 30 has an evaporable surface 33 of substantially rectangular shape. In a preferred embodiment, the cathode 30 is carbon, but it may be composed of any suitable evaporable material. The cathode body 31 is mounted on a holder 32 and situated in entrance arm 36 of plasma duct 34. Cathode 30 is connected to the negative output of an arc power supply 28, and plasma duct 34 (which also serves as an anode) is connected to the postive output of the arc power supply. An arc striker 35 is provided for igniting an arc discharge between cathode 30 and anode 34. Cathode 30 and evaporable surface 33 may also be surrounded by insulators 86 (reference FIG. 4). With continued reference to FIG. 4, it may be seen that an internal electrode 82 is mounted within the plasma duct 34, as is sensor 84.

Plasma duct 34 has a rectangular cross-sectional shape of similar dimensions to cathode 30. The plasma duct includes a bend in the axis along the centerline of the plasma duct. In the embodiment shown here, an equivalent inner radius bend point 37 is shown on one of the walls of the duct and is approximately 90°, but an inner radius angle in the range of approximately 15° to 120° is suitable for the practice of this invention. An equivalent outer radius bend is indicated generally at reference numeral 39. The plasma duct 34 has an entrance arm 36 and an exit arm 38 on either side of inner radius bend point 37. The cathode 30 is mounted on an isolated holder 32 at or near the end of the entrance arm so that the evaporable surface 33 of the cathode faces into the plasma duct. One or more substrates 44 to be coated may be located in an area at or near the end of exit arm 38.

Figure 3:
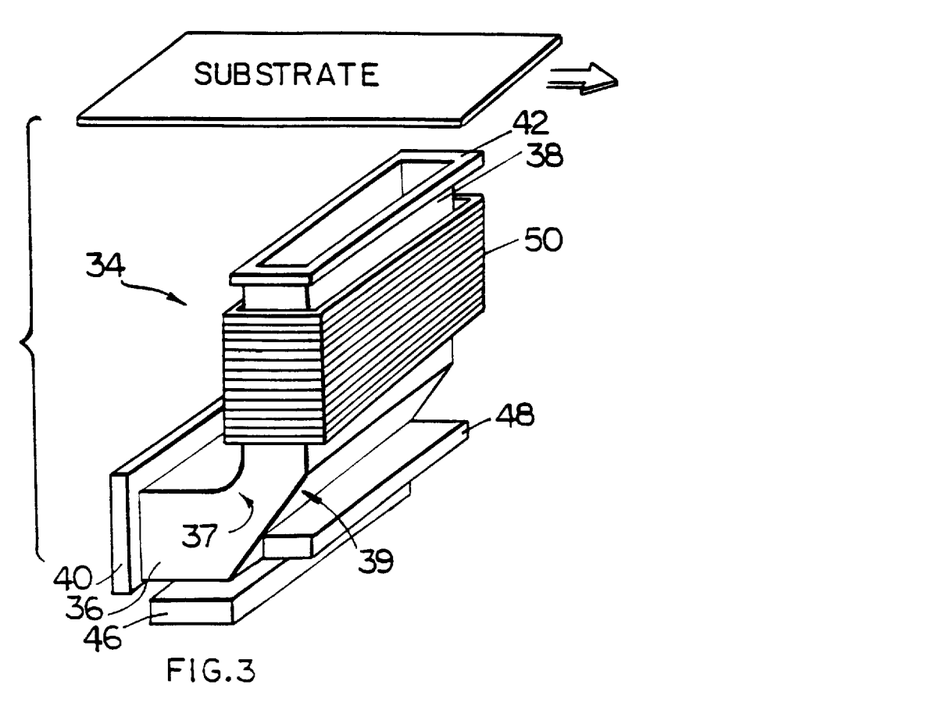
FIG. 3 is a perspective view of the duct assembly and magnets of the present invention.

A set of electromagnets is disposed about plasma duct 34. Magnet 46 is connected to coil power supply 52 and is located near the entrance arm 36 of the plasma duct. Magnet 48 is connected to coil power supply 52 and is located near the outer radius 39 of the bend in plasma duct 34. Magnet 50 is a solenoid connected to coil power supply 52 and it wraps around a portion of the exit arm 38 of the plasma duct. The perspective view of FIG. 3 shows magnets 46, 48 and 50 in relation to the plasma duct 34, with magnet 46 near the entrance arm 38, magnet 48 near the outer radius 39 of the bend, and magnet 50 coiled around the exit arm 38.

Figure 4:
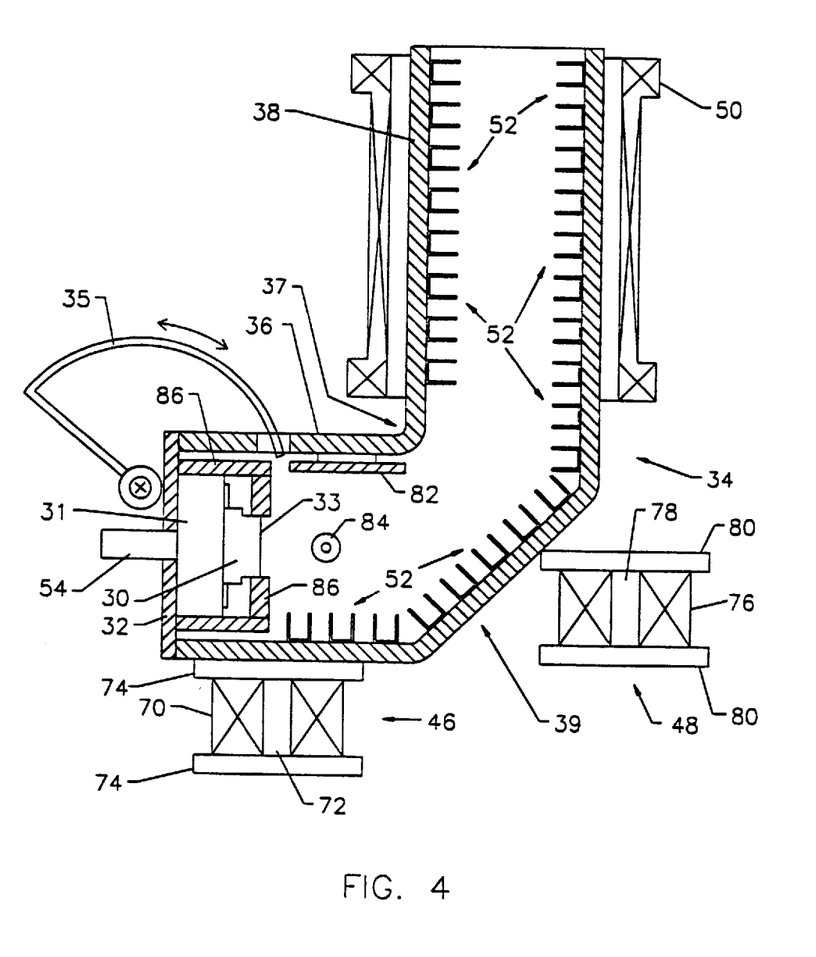
FIG. 4 is an end elevational cross section of the duct assembly of the present invention.

With reference to FIG. 4, it may be understood that magnet 46 includes a coil 70 wrapped around a central pole 72 of magnetically permeable material, with end plates 74 attached to each end of the central pole. Likewise, magnet 48 includes a coil 76 wrapped around a central pole 78 of magnetically permeable material, with end plates 80 attached to each end of the central pole. In the embodiment shown, end plates 80 of magnet 48 are made of magnetically permeable material, while the end plates 74 of magnet 46 are made of nonpermeable material, in order to shape the magnetic field in the desired manner.

Again with reference to FIG. 2, it may be seen that conduit 54 feeds water to the cathode 30. Plasma duct 34 and internal electrode 82 may also preferably be water cooled, but provisions for such cooling are not shown. A bias voltage may be applied to the substrate 44, and the substrate may be conventionally rotated and/or translated during deposition. In a preferred embodiment, the plasma duct 34 and substrate 44 are enclosed within a chamber (not shown) and a vacuum is drawn. In another preferred embodiment of the invention, the plasma duct 34 and cathode holder 32 of the duct are in vacuum, while the outside of the duct is at atmospheric pressure.

Figure 5:
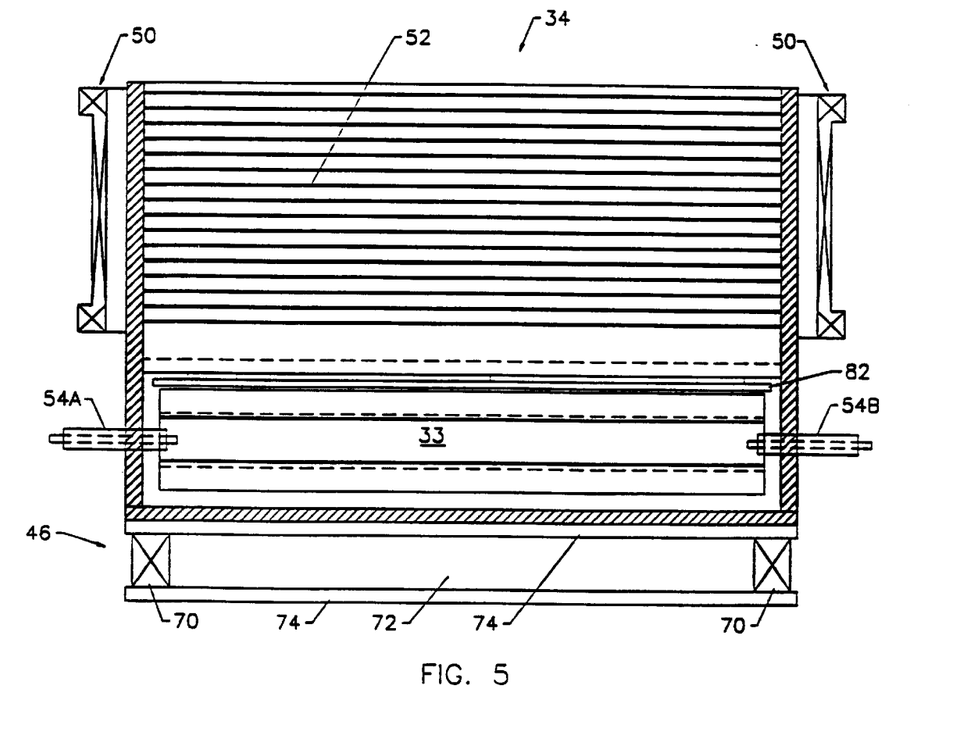
FIG. 5 is a side elevational cross section of the duct assembly of the present invention.

Proceeding to the cross sectional views of FIGS. 4 and 5, which are numbered with the same reference numerals previously used, certain additional details of the system of this invention may now be understood. It may be seen that the bend in the plasma duct 34 serves to prevent a line-of-sight between the cathode 30 and the substrate 44 (not shown in FIGS. 4 or 5, but understood to be located at or near the end of the exit arm 38 of the duct). The inside walls of the exit arm 38, the entrance arm 36 and the bend of the plasma duct 34 are preferentially lined with a number of spaced apart baffles 52 which are substantially perpendicular to the inside walls and substantially parallel to one another.

With reference to FIG. 4, an electrically isolated internal electrode 82 may be seen mounted inside the plasma duct 34. It may be electrically floating with respect to the anode, or it may be biased positively with respect to the anode. With reference to FIG. 5, a pair of sensors 54 are located adjacent to each end of the evaporable surface of cathode 30, with 54A adjacent the left end and 54B adjacent the right end.

Figure 6:
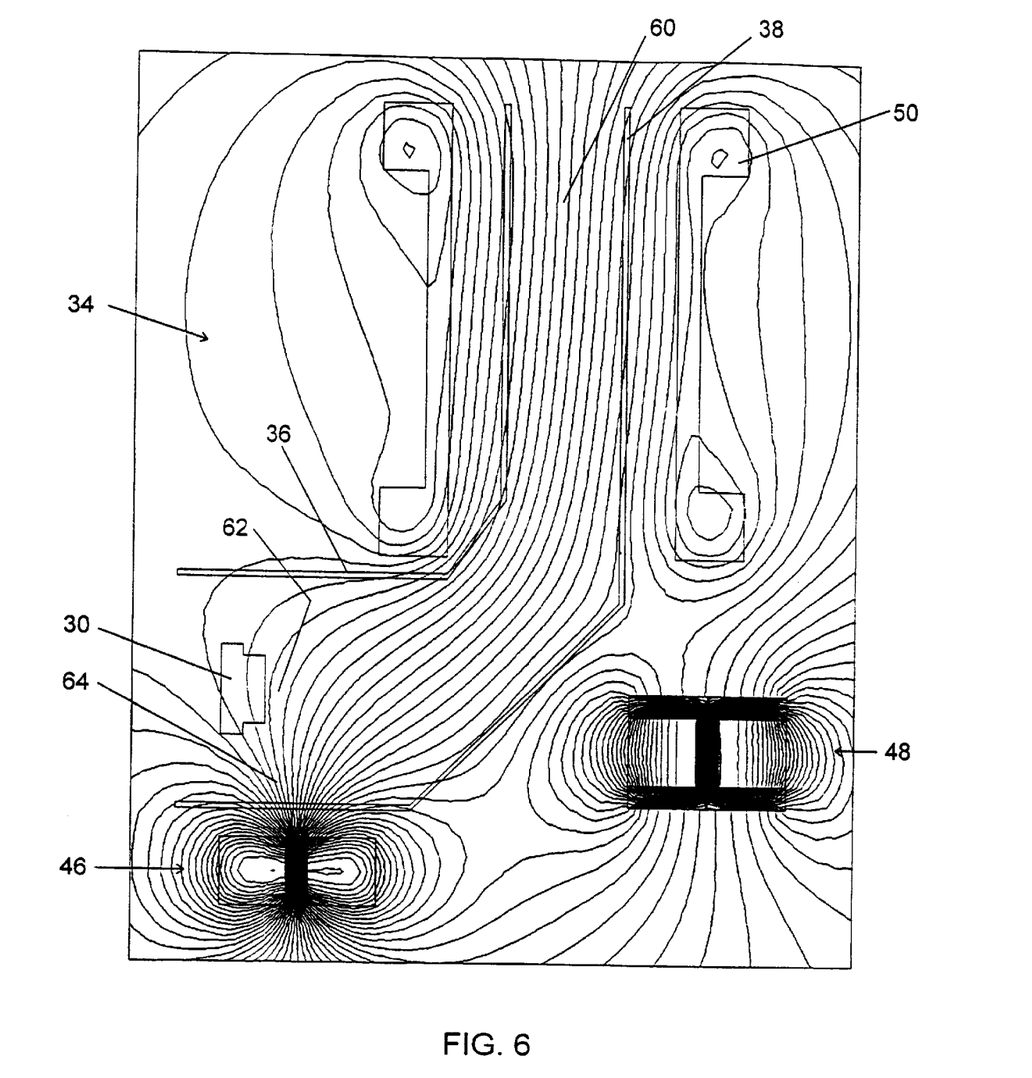
FIG. 6 is an end cut-away view showing the magnetic field lines and magnetic field mirror of the present invention in relation to the duct assembly and magnet sets thereof.

The magnets 46, 48 and 50 generate a magnetic field represented by magnetic flux lines that may be better understood with reference to FIG. 6. Magnetic flux lines 60 are oriented in a direction substantially parallel to the axis of plasma duct 34 within exit arm 38. Magnetic flux lines 62 are oriented in a direction substantially parallel to the evaporable surface 33 (not shown in FIG. 6, but understood with reference to FIGS. 2, 4, and 5) of cathode 30 within the region of the entrance arm 36 near the cathode. Magnetic flux lines converge at a region 64 within the entrance arm 36, forming a magnetic mirror adjacent to the evaporable surface 33 (not shown in FIG. 6, but understood with reference to FIGS. 2, 4, and 5) of cathode 30.

The representation of magnetic flux lines 60 shown in FIG. 6 was generated by a commercially available finite element magnetic analysis program. In the particular case shown, magnets 50 and 46 have 600 amp-turns, while magnet 48 has 200 amp-turns. In this case, the field strength in the center of the exit arm 38 of the duct is approximately 50 gauss. It can be seen in this case that the flux density (field strength) at the outer radius 39 of the bend in the duct is approximately equal to the flux density at the inner radius 37 of the bend. By adjusting the number of turns in coil 76 of magnet 48, or the current flowing through it (i.e., adjusting the amp-turns), the flux density at the outer radius 39 of the bend may be adjusted independently of the flux density elsewhere in the duct.

The sensors 54A and 54B (reference FIG. 5) are able to sense an arc spot and to produce a signal whenever the arc spot approaches either the left or right end, respectively, of the cathode 30. Sensors 54 may, for example, consist of electrically isolated wires extending into the plasma duct 34, with the wires connected to the anode through a resistor (not shown) of, say, 1000 ohms, thus providing an electrical voltage whenever the arc approaches the wire. Alternatively, sensors 54 may comprise a light-sensitive diode which detects the optical emission from the arc jet, or a magnetic field detector which senses the magnetic field of the arc. The coil power supply 52 (reference FIG. 2) has a switch 53 capable of reversing the direction of current flow through the magnets, and it is connected by conventional control means (not shown) to the sensors 54 so as to actuate a magnetic field reversal. The magnetic field reversal can occur simultaneously in all of the magnets and will reverse the direction of the magnetic flux lines without substantially changing the shape of the flux lines or their orientation with respect to the plasma duct. Alternatively, only one or both of magnets 46 and magnet 48 may be reversed.

In a desirable configuration of the system of this invention (not separately shown), the magnets are powered independently by more than one coil power supply 52. The use of more than one coil power supply permits the current of the magnets to be varied independently of one another for adjusting the magnetic field strength independently in different parts of plasma duct 34. At the same time, the separate coil power supplies are each provided with control systems so that they all reverse the direction of current simultaneously upon actuation by a signal from sensors 54.

From the foregoing description, it may be readily understood that the system of this invention operates as follows.

Arc starter 35 ignites an arc discharge between cathode 30 and the plasma duct 34 which serves as the anode. The arc discharge originates in an arc spot on the evaporable surface of the cathode and generates a plasma containing an ionized vapor of the cathode material.

Plasma duct 34 directs the plasma generated by the arc discharge from the cathode to a substrate 44 to be coated and/or implanted and which is located at or near the exit arm 38 of the duct. The plasma duct 34 has a rectangular cross-sectional shape of similar dimensions to the cathode 30, and has a bend of approximately 15–180 degrees in the axis along its centerline (in the embodiment illustrated, the the inner radius 37 of the bend is 90 degrees), with the entrance arm 36 and exit arm 38 separated from line-of-sight of one another by the bend. The cathode 30 is located at or near the end of entrance arm 36 with its evaporable surface facing into the plasma duct, and the substrate 44 is located in an area at or near the end of exit arm 38.

The magnets 46, 48 and 50 generate within the plasma duct 34 and over the evaporable surface of cathode 30 a magnetic field, which is represented by magnetic flux lines. Magnetic flux lines are oriented in a direction substantially parallel to the axis of duct 34 within exit arm 38. Magnetic flux lines are oriented substantially parallel to the evaporable surface of cathode 30 within the region of entrance arm 36 at or near the cathode. Magnetic flux lines also converse in a region within entrance arm 36 of plasma duct 34, forming a magnetic mirror adjacent and parallel to the rectangular cathode 30. The magnetic flux lines direct the ionized vapor through the bend in the plasma duct and urge the arc spot into a generally linear motion along the length of the evaporable surface 33 of the cathode 30. The magnetic mirror is oriented in a direction which reflects plasma towards the exit arm 38 of plasma duct 34.

The sensors 54 sense the arc spot, and produce a signal whenever the arc spot approaches either end of said evaporable surface. The signal from the sensors actuates a control system which reverses the current in the coil power supply 52, thereby reversing the direction of the magnetic flux lines without substantially changing the shape of the flux lines or their orientation with respect to plasma duct 34. Thus, the arc spot is urged, not only to scan in a linear direction over the surface of the rectangular cathode 30, but to scan back and forth in a generally end to end path.

The inside walls of the plasma duct 34 are lined with baffles 52. Macroparticles are filtered by the bend in the duct, and the baffles serve to trap the macroparticles.

The system of this invention includes a long and narrow rectangular source and a relatively compact duct having a rectangular cross section of dimensions similar to the source. A compact duct is thereby created. For example, good results have been obtained using a cathode target approximately 30 centimeters long by 2.5 centimeters wide, or a ratio between the length and the width of about twelve to one. Because the rectangular cathode of this invention may be extended indefinitely, it is expected that even higher ratios are attainable.

Accordingly, it can be understood that this invention provides a way to generate and direct a plasma beam over a rectangular area, for the purpose of forming a coating or performing ion implantation on a substrate.

As has been explained, the benefits of the present invention are realized by: (a) the rectangular shape of the cathode source material, (b) the rectangular cross sectional shape of the plasma duct, (c) the control of the arc movement on the cathode by reversing polarity of the magnetic field to cause the arc to scan generally in a linear direction back and forth across the length of the rectangular source, and (d) the shape and control of the magnetic field in the plasma duct.

In particular, the magnetic field shape and control of the arc upon the rectangular source of the present invention make it possible to construct a compact, efficient plasma source with a rectangular output aperture which can be made as long as desired, thus providing the benefits of a filtered cathodic arc in combination with the benefits of a rectangular deposition source. The field reversal technique for arc control allows the width of the cathode source to be made much smaller than is possible using the racetrack-style magnetic field of the prior art.

The plasma filtering duct can therefore be made much narrower and shorter, resulting in a compact design which is easier to integrate into a vacuum system than the bulky filters of the prior art. The narrow cathode and narrow linearly scanning arc also permit more uniform erosion of the target along its length and results in higher source material utilization than is possible with planar racetrack-style cathodes.

The advantages of the present invention permit the source to be extended indefinitely in length, thus providing the benefits of filtered arc deposition or implantation to applications requiring rectangular or extended vapor sources.

What is claimed is:

1. An apparatus for a vacuum arc discharge, said apparatus comprising:

(a) a cathode composed at least in part of a material to be evaporated, said cathode having an evaporable surface of substantially rectangular shape, (b) sensing means operatively connected at or near each of a pair of opposite ends along a length of said evaporable surface for sensing when an arc spot approaches either of said opposite ends, said sensing means capable of generating a signal when the arc spot approaches either of said opposite ends, (c) magnetic field establishing means for establishing over said evaporable surface a magnetic field, said magnetic field being represented by magnetic flux lines, said magnetic field establishing means being independent of an electrical current flowing through said cathode, and said flux lines having a predominant component which is substantially parallel to said evaporable surface and substantially perpendicular to the length thereof, and (d) magnetic field reversing means for reversing the direction of said magnetic flux lines responsive to said signal from said sensing means without substantially changing the shape of said predominant component thereof or its orientation with respect to said evaporable surface.

2. The apparatus of claim 1 wherein the length of said evaporable surface of substantially rectangular shape is substantially parallel to a first edge of said surface and said evaporable surface has a width substantially parallel to a second edge of said surface at about a right angle to said first edge, wherein the length is at least twice as long as the width.

3. The apparatus of claim 2 wherein the length is at least five times as long as the width.

4. The apparatus of claim 3 wherein the length is at least ten times as long as the width.

5. A plasma duct for a vacuum arc discharge, said plasma duct comprising:

(a) an entrance arm of rectangular cross section having a width and a length in substantially the same proportions as, and at least as large as, those of a substantially rectangular cathode adopted to be mounted at or near said entrance arm, (b) an exit arm of rectangular cross section, the plasma duct having an axis alone a center line passing from the entrance arm through the exit arm, (c) a bend between said entrance arm and said exit arm, said bend having an inner radius and an outer radius, and (d) magnetic field generating means disposed in relation to said plasma duct for generating within said duct a magnetic field having a magnetic flux density in the vicinity of said outer radius which is greater than or equal to the magnetic flux density in the vicinity of said inner radius, said magnetic field being represented by magnetic flux lines, a portion of said magnetic flux lines being oriented in a direction substantially parallel to the axis of said plasma duct within said exit arm.

6. The plasma duct of claim 5 wherein said magnetic field generating means further comprises means for generating within said duct a magnetic field, said magnetic field being represented by magnetic flux lines, and said magnetic field including a region in which said flux lines converge forming a magnetic mirror, said magnetic mirror being oriented in a direction perpendicular to a wall of the duct in the region of said duct in which said magnetic mirror is generated.

7. The apparatus of claim 5 wherein said bend is within a range of 10–120 degrees.

8. The apparatus of claim 7 wherein said bend is within a range of 10–90 degrees.

9. The plasma duct of claim 5 further comprising a set of baffles disposed on the inside of the duct.

10. The plasma duct of claim 5 wherein said rectangular cross section of said entrance arm has a length and a width wherein the length is at least twice as long as the width.

11. The plasma duct of claim 10, wherein the length is at least five times as long as the width.

12. The plasma duct of claim 11, wherein the length is at least ten times as long as the width.

13. A method of controlling an arc discharge between a cathode composed at least in part of a material to be evaporated, and an anode, said arc discharge originating in an arc spot on an evaporable surface of the cathode having a length and a width, said method comprising:

(a) establishing over said evaporable surface a magnetic field, said magnetic field being represented by magnetic flux lines, said magnetic field establishing means being independent of a electrical current flowing through said cathode, and said flux lines having a predominant component which is substantially parallel to said evaporable surface and substantially perpendicular to the length thereof;

(b) detecting whenever said arc spot approaches either end of the length of said evaporable surface of the cathode; and (c) whenever said arc spot detected by said detecting step approaches either end of said evaporable surface of the cathode, reversing the direction of said magnetic flux lines without substantially changing the shape of said predominant component thereof or its orientation with respect to said evaporable surface.

14. An apparatus for generating a beam of plasma containing an ionized vapor of a cathode material, in which a vacuum arc discharge is used to vaporize said cathode material, comprising:

(a) a cathode having an evaporable surface of substantially rectangular shape;

(b) an anode;

(c) an arc power supply operatively connected to the cathode and the anode;

(d) a plasma duct for transporting to a substrate area in which an object to be coated or implanted may be located, at least part of the plasma containing an ionized vapor of the cathode, said plasma generated by an arc discharge from said cathode, and said plasma duct having a rectangular cross-sectional shape and a width and a length in substantially the same proportions as, and at least as large as, those of said cathode, said plasma duct containing a bend in the axis along its centerline, forming in said plasma duct an entrance arm and an exit arm, said cathode being located at or near the end of said entrance arm with said evaporable surface facing into said plasma duct, and said substrate area being located at or near the end of said exit arm, (e) magnetic field generating means in electromagnetic communication with said plasma duct for generating within the plasma duct and over said evaporable surface of said cathode a magnetic field, said magnetic field being represented by magnetic flux lines, at least a first portion of said magnetic flux lines being oriented in a direction substantially parallel to the axis of said duct within said exit arm, and at least a second portion of said flux lines having a predominant component oriented substantially parallel to said evaporable surface of said cathode within the region of said entrance arm at or near said cathode;

(f) sensor means for sensing an arc spot, said sensor means located adjacent to each end of said rectangular evaporable surface of said cathode, said sensor means being capable of producing a signal whenever said arc spot approaches either end of said evaporable surface; and (g) magnetic field reversing means responsive to said signal from the sensor means for reversing the direction of at least said second portion of said magnetic flux lines without substantially changing the shape of said second portion of said flux lines or their orientation with respect to said plasma duct.

15. The apparatus of claim 14 wherein said bend has an inner radius and an outer radius, and wherein said magnetic field generating means further comprises means for generating within said duct a magnetic field having magnetic flux density (field strength) in the vicinity of the outer radius which is greater than or equal to the flux density in the vicinity of the inner radius.

16. The apparatus of claim 15 wherein said bend is within a range of 10–120 degrees.

17. The apparatus of claim 16 wherein said bend is within a range of 45–90 degrees.

18. The apparatus of claim 14 further comprising magnetic field reversing means for reversing the direction of the first portion of said magnetic flux lines without substantially changing the shape of said flux lines or their orientation with respect to said plasma duct.

19. The apparatus of claim 14, wherein:
   (a) said magnetic field generating means comprises at least one electromagnetic coil, and
   (b) said magnetic field reversing means comprises at least one electromagnet power supply capable of passing current through said electromagnetic coil in either direction, and said electromagnet power supply being capable of reversing the direction of current flow through said electromagnetic coil based on the signal from said sensor means.

20. The apparatus of claim 19, wherein:
   (a) said magnetic field generating means further comprises at least two electromagnet coils,
   (b) said magnetic field reversing means further comprises at least two electromagnet power supplies capable of passing current in either direction, said at least two electromagnet power supplies being capable of reversing the direction of current flow through said electromagnet coils simultaneously based on the signal from said sensor means,
   (c) said at least two electromagnet power supplies having current varying means for independently varying the current in said electromagnet coils in order to adjust the magnetic field strength independently in different parts of said plasma duct.

21. The apparatus of claim 14 wherein said magnetic field generated by said magnetic field generating means includes a region within said entrance arm of said plasma duct in which said magnetic flux lines converge, forming a magnetic mirror adjacent and parallel to said rectangular cathode, said magnetic mirror being oriented in a direction which reflects plasma towards said exit arm of said plasma duct.

22. The apparatus of claim 14 wherein said anode means include said plasma duct.

23. The apparatus of claim 14 wherein said anode means are electrically connected to said plasma duct.

24. The apparatus of claim 14 further comprising at least one electrically isolated electrode mounted inside said plasma duct, said electrode being electrically floating with respect to said anode.

25. The apparatus of claim 14 further comprising at least one electrically isolated electrode mounted inside said plasma duct, said electrode being biased positively with respect to said anode.

26. The apparatus of claim 14 wherein said anode includes an electrically isolated electrode.

27. The apparatus of claim 14 wherein at least a part of an inside wall of said plasma duct is lined with baffles.

28. The apparatus of claim 27 wherein said baffles include a plurality of walls mounted substantially parallel to one another and substantially perpendicular to said inside wall of said plasma duct and extending part way into said duct.

29. The apparatus of claim 14 wherein said plasma duct is electrically floating with respect to said anode.

30. The apparatus of claim 14 wherein said plasma duct is electrically biased positively with respect to said anode.

* * * * *